United States Patent [19]
Colgan et al.

[11] Patent Number: 5,281,485
[45] Date of Patent: Jan. 25, 1994

[54] STRUCTURE AND METHOD OF MAKING ALPHA-TA IN THIN FILMS

[75] Inventors: Evan G. Colgan, Wappingers Falls; Peter M. Fryer, Mamaroneck, both of N.Y.

[73] Assignee: International Business Machines Corporation, Armonk, N.Y.

[21] Appl. No.: 3,959

[22] Filed: Jan. 15, 1993

Related U.S. Application Data

[63] Continuation of Ser. No. 604,556, Oct. 26, 1990, abandoned.

[51] Int. Cl.⁵ .............................................. B32B 15/04
[52] U.S. Cl. .................................... 428/457; 428/469; 428/472; 428/698; 428/704; 428/938; 204/192.15; 204/192.17; 204/192.21; 36/305; 501/134
[58] Field of Search ............... 427/250, 252, 253, 294; 501/134; 428/469, 472, 215, 216, 457, 938, 698, 704; 204/192.15, 192.17, 192.21; 361/305

[56] References Cited

U.S. PATENT DOCUMENTS

| | | | |
|---|---|---|---|
| 3,406,043 | 11/1964 | Balde | 428/216 |
| 3,558,461 | 1/1971 | Parisi | 204/192 |
| 3,663,408 | 5/1972 | Kumagai et al. | 204/192.15 |
| 3,847,658 | 11/1974 | Kumagai | 117/201 |
| 3,878,079 | 4/1975 | Schauer | 204/192 |
| 4,058,445 | 11/1977 | Anders | 204/192 SP |
| 4,251,326 | 2/1981 | Arcidiacono et al. | 204/15 |
| 4,364,099 | 12/1982 | Koyama et al. | 361/305 |

FOREIGN PATENT DOCUMENTS 1015143  9/1962  United Kingdom ........... 204/192.21

OTHER PUBLICATIONS

R. Petrovic et al., "Electrical and Structural Properties of Tantalum Nitride Films Deposited by Sputtering," Thin Solid Films, vol. 57, pp. 333-336 (1979).
L. I. Maissel, et al., "Handbook of Thin Film Technology," McGraw-Hill, Inc., pp. 18-12 to 18-13 (1970).
L. G. Feinstein, et al., "Factors Controlling the Structure of Sputtered Ta Films," Thin Solid Films, vol. 16, pp. 129-145 (1973).
N. Schwartz, et al., "Impurity Effects in the Nucleation of Alpha (bcc)-Tantalum or Beta-Tantalum Films," J. Electrochem. Soc.: Solid-State Science and Technology, vol. 124, No. 1, pp. 123-131 (Jan. 1977).
Pearson's Handbook of Crystallographic Data for Intermetallic Phases vol. 3, American Society for Metals, pp. 3218, 2791 and 2792.
Binary Alloy Phase Diagrams, Second Edition, American Society for Metals, Ta-N Phase Diagram, pp. 2703-2704.

*Primary Examiner*—Ellis P. Robinson
*Assistant Examiner*—Timothy M. Speer
*Attorney, Agent, or Firm*—Aziz M. Ahsan

[57] ABSTRACT

The present invention relates generally to a structure and a method of making Alpha-Ta films, and more particularly, to a structure and a method of making Alpha-Ta in thin films. A seed layer of Ta reactively sputtered in a nitrogen containing environment is grown on the substrate, and using this seed layer of Ta(N) layers of Alpha-Ta are then formed.

26 Claims, 3 Drawing Sheets

STRUCTURE AND METHOD OF MAKING ALPHA-TA IN THIN FILMS

This patent application is a continuation of U.S. patent application Ser. No. 07/604,556, filed on Oct. 26, 1990, now abandoned.

FIELD OF THE INVENTION

The present invention relates generally to a structure and a method of making alpha-Ta films, and more particularly, to a structure and a method of making alpha-Ta in thin films. A seed layer of Ta reactively sputtered in a nitrogen containing environment is grown on the substrate, and using this seed layer of Ta(N) layers of alpha-Ta are then formed.

BACKGROUND OF THE INVENTION

Tantalum metal has two crystalline phases: the low resistivity (12-20 micro-ohm-cm) alpha (bcc) (body centered cubic) phase and a higher resistivity (160-170 micro-ohm-cm) beta (tetragonal) phase. Due to the lower resistivity of the alpha phase, it is preferred for electronic applications over the beta phase.

Tantalum films are generally deposited by magnetron sputtering; however, the beta phase is usually formed for films of typical thickness (less than 3000 angstroms) which are deposited by conventional sputtering methods. This is illustrated in FIG. 1A, where beta-tantalum has been formed on a substrate.

Most of the literature is inconsistent regarding methods for reproducibly depositing a particular phase of tantalum in a predictable fashion. Some researchers have produced results which suggest that there are two main variables which determine what phase of tantalum is grown: the first variable is the substrate temperature during deposition and the second variable is the amount of gaseous contamination in the vacuum system. This has been discussed by L. Maissel and R. Glang, in "Handbook of Thin Film Technology," McGraw-Hill, page 18-12 (1970). They reported that if the substrate temperature exceeds 600° C., the alpha phase is formed; also, if the base pressure of the vacuum system is high, indicating high water vapor, nitrogen, and oxygen content, the alpha phase may result.

These findings are not very useful for electronics applications because processing temperatures above 400° C are typically not compatible with device fabrication. It is also difficult to maintain and control such a high substrate temperature during sputtered metal deposition. Furthermore, it is difficult to keep a controllable amount of impurities in the system.

In addition, other studies, including one by N. Schwartz and E. D. Feit, have found that they could not use these results to consistently predict which phase of tantalum would grow. See, N. Schwartz and E. D. Feit, "Impurity Effects in the Nucleation of Alpha (bcc)-Tantalum or Beta-Tantalum Films", Journal of the Electrochemical Society, Vol. 124, No. 1, pages 123-131 (January 1977). Schwartz and Feit proposed instead the existence of an "X" impurity which results in the formation of alpha tantalum. The difference between their work and that discussed by L. Maissel and R. Glang, was their hypothesis that the "X" impurity could simply be something on the substrate instead of something in the gas phase in the vacuum chamber.

Finally, G. Feinstein and R. D. Huttemann studied substrate effects on the formation of alpha tantalum. G. Feinstein and R. D. Huttemann, "Factors Controlling the Structure of Sputtered Tantalum Films", Thin Solid Films, Vol. 16, pages 129-145 (1973). They divided substrates into three groups: Group I contained substrates onto which only beta tantalum could be formed and included such substrates as 7059 glass, quartz, sapphire, and metals such as copper and nickel. Group II contained substrates onto which only alpha (bcc) tantalum could be grown. This group included substrates that had been coated with 5000 angstroms thick metal films such as gold, platinum, or tungsten. Finally, Group III consisted of substrates which normally produced alpha tantalum, but could be induced to yield beta tantalum or mixtures of alpha and beta by suitable treatment of the surface. These included substrates coated with 5000 angstroms of molybdenum, silicon nitride, or stochiometric tantalum nitride ($Ta_2N$). The use of such thick underlayers, as described by G. Feinstein and R. D. Huttemann makes it impractical to use this concept to produce alpha tantalum for electronics use. Since it is generally preferred to not introduce extra materials into a device structure, the use of different materials (such as tungsten or molybdenum) is impractical for electronics use.

Parisi in U.S. Pat. No. 3,558,461, discloses a method for fabricating thin film tantalum based resistors by reactive sputtering of tantalum in the presence of oxygen and nitrogen, followed by anodization and thermal pre-aging of the resultant deposited film. The films were reactively sputtered in $N_2$ and $O_2$ containing ambient to control the TCR (Thermal Coefficient of Resistance). The resistivity ranged from 300 to 1500 micro-ohm-cm. The resulting film is referred to as "tantalum oxynitride," which is different than the alpha tantalum films that are produced by the process of this invention.

Kumagai, U. S. Pat. No. 3,847,658, discloses depositing nitrogen-doped beta-tantalum. A thin-film electrode comprising nitrogen-doped beta-tantalum is deposited upon a suitable electrically non-conductive substrate. The process produces $N_2$ doped beta tantalum for capacitor formation, as opposed to the alpha tantalum disclosed in this invention. The films have 0.1 percent to 10 percent $N_2$, and resistivities 10 atomic percent to 50 percent higher than that of pure beta Ta films. Furthermore, beta tantalum was grown on a $Ta_2O_5$ underlayer, whereas, the inventors of this invention disclose the use of Ta(N) as the seed or underlayer for the formation of alpha-Ta.

Schauer in U.S. Pat. No. 3,878,079, discloses a method for producing thin films of tantalum in the alpha phase bcc (body centered cubic) lattice by heating a substrate to a temperature above 300° C. and applying a high frequency discharge to a tantalum target member. The growth of alpha or beta tantalum depends on the $N_2$ partial pressure in the sputtering gas. A nitrogen partial pressure is provided in the sputtering atmosphere, and by decreasing the nitrogen partial pressure, TaN, $Ta_2N$, and finally alpha tantalum were successively formed. This alpha tantalum was highly doped with foreign gases, in contrast with the invention described in this patent application which is pure alpha Ta. With further reduction in $N_2$ partial pressure, beta Ta is formed, and with still further reduction, alpha Ta can again be formed if the substrates are heated to over 300° C. The resulting film resistivity of that alpha-tantalum produced at above 300° C. was 25 micro-ohm-cm. In contrast, only modest substrate heating is required in the process of this invention, and the reactive gas is only required for deposition of the seed layer, and not for the rest of the film as disclosed by Schauer. A Ta$_2$O$_5$ underlayer was used by Schauer to allow for easier substrate cleaning; his underlayer is not responsible for the production of the alpha tantalum film.

Anders, U.S. Pat. No. 4,058,445, discloses a method for producing thin film tantalum capacitors having a tantalum thin film electrode mounted on a nonconducting support member. The tantalum electrode is doped with nitrogen to produce a nitrogen content in a range from the nitrogen content of beta-tantalum to that for tantalum nitride. The process of Anders' invention produces "alpha" tantalum deposited on a Ta$_2$O$_5$ coated substrate by introducing N$_2$ into the argon sputtering gas at a partial pressure of 10$^{-5}$ torr. These "alpha" tantalum films have high resistivity (100 micro-ohm-cm) with presumably high N$_2$ content.

Arcidiacono et al. in U.S. Pat. No. 4,251,326, disclose a method for fabricating thin film RC networks by forming alpha tantalum capacitor base electrodes on a substrate while simultaneously forming alpha tantalum anodization bus bars on the substrate. The alpha-tantalum film was obtained by sputtering a tantalum film on the substrate, thermally oxidizing the tantalum film to form an underlayer, and then sputtering an alpha tantalum film over the deposited Ta$_2$O$_5$ underlayer. The purpose of the underlayer is to protect the substrate from attack by corrosive etchants during subsequent processing, and apparently has nothing to do with the formation of alpha Ta. This is different than the invention of the applicants where the Ta(N) seed layer or underlayer is required to produce the alpha tantalum. Alpha tantalum was deposited by Arcidiacono in a Ar-N$_2$ atmosphere at 3-6 mT pressure. The resulting film has BCC structure and contained 10–20 percent N$_2$. The invention of this disclosure has Ta films that have nitrogen in the seed layer only, and not throughout the bulk of the structure. Koyama et al. (U.S. Pat. No. 4,364,099) discloses tantalum thin film capacitors, which are formed on a substrate which is reactively sputtered with tantalum in a nitrogen containing atmosphere (argon gas with nitrogen gas incorporated in an amount of from 10 to 30 percent) to deposit a highly nitrogen-doped tantalum film having a nitrogen concentration of from 14 to 30 atomic percent. Subsequently a layer of an alpha-tantalum thin film to form the lower electrode is sputtered on the highly nitrogen-doped tantalum film, this second thin film has a nitrogen concentration of from 6 to 15 atomic percent. This intermediate product is then further processed to obtain a tantalum thin film capacitor. During sputtering the temperature of the substrate was maintained at 250° C. The thickness of the highly nitrogen-doped tantalum film was from 100 to 200 nm (1,000 to 2,000 angstroms), and the thickness of the nitrogen doped alpha-tantalum thin layer was at least 100 nm (1,000 angstroms).

OBJECTS AND SUMMARY OF THE INVENTION

An object of this invention is to provide a method for making Alpha-Ta in thin films.

Another object of this invention is to provide a simple and highly reproducible method of producing thin Alpha-Ta films.

Still another object of this invention is to keep the resistivity (less than or equal to 40 micro-ohm-cm) of the final structure low enough to make the film a candidate for use in electronics applications.

Another object of this invention is the usage of Ta reactively sputtered in nitrogen as a seed layer to form alpha Ta during subsequent sputtering.

Yet another object of this invention is the process window for the formation of the Ta(N) seed layer.

In one aspect, this invention discloses a method of making an alpha-Ta layer on a substrate comprising the steps of:
 (a) forming a seed layer of Ta(N), reactively sputtered in a nitrogen containing ambient, on the substrate, and
 (b) depositing a layer of alpha-Ta on the Ta(N) seed layer.

In another aspect this invention discloses a structure comprising a seed layer of Ta(N) on a substrate, and an additional layer of alpha-Ta on the seed layer.

In yet another aspect this invention discloses a structure comprising a seed layer of Ta(N) on a substrate, and having an additional layer of alpha-Ta on the Ta(N) seed layer, and wherein the seed layer of Ta(N) is at least 20 angstroms thick.

The thickness of the seed layer of Ta(N) could be between 20 and 500 angstroms, or it could be between 20 and 40 angstroms.

The seed layer of Ta(N) preferably contains between 0.1 and 50.0 atomic percent nitrogen, and more preferably between 1 and 35 atomic percent nitrogen. Henceforth, all references to percent nitrogen are meant to be atomic percent nitrogen. Precise control of the nitrogen content (as needed for stochiometric Ta$_2$N) is not needed.

The alpha-Ta layer could be deposited at temperatures of preferably between 100° C. and 600° C., and more preferably between 200° C. and 300° C., or the alpha-Ta layer could be deposited at temperatures of equal to or less than 200° C.

The resistivity of the alpha-Ta layer is equal to or less than 40 micro-ohm-cm.

The total thickness of the Ta(N) seed layer and the alpha-Ta layer is preferably between 100 angstroms and 4,000 angstroms, and more preferably between 500 angstroms and 2,000 angstroms.

The layer of alpha-Ta can be at least 100 angstroms thick.

A product can also be made by the method of this invention.

Similarly, an article of manufacture can also be made by the method of this invention.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1A:
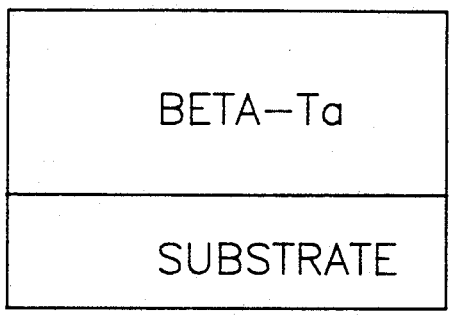
FIG. 1A is a cross-sectional schematic view of a typical sputtered Ta film deposited by the prior art methods.
Figure 1B:
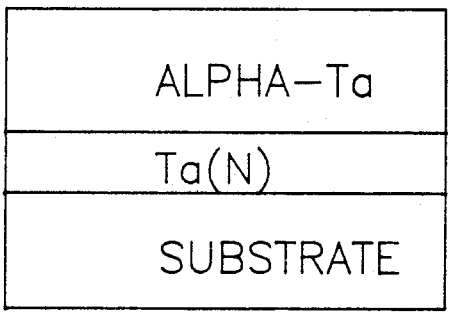
FIG. 1B is a cross-sectional schematic view of an embodiment of this invention showing the use of Ta(N) seed layer to form alpha-Ta.
Figure 3B:
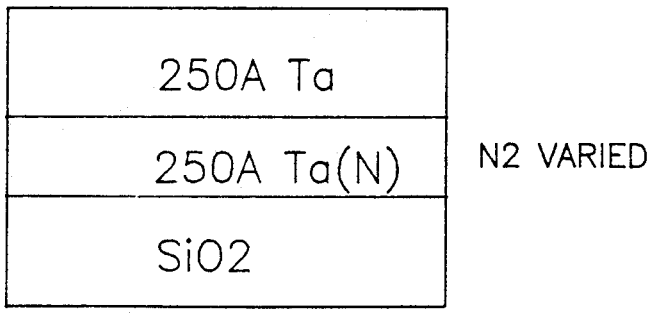
FIG. 3B illustrates a cross-sectional schematic view of a typical sample prepared to generate the plot for FIG. 3A.

This invention discloses a simple process to reproducibly deposit alpha (bcc) tantalum on a substrate. The process comprises first depositing a thin seed layer or underlayer of tantalum doped with a small amount of nitrogen, and hereinafter referred to as Ta(N). This is followed by depositing the required tantalum film thickness in the conventional way. A typical structure formed by the method of this invention is shown in FIG. 1B.

Figure 2B:
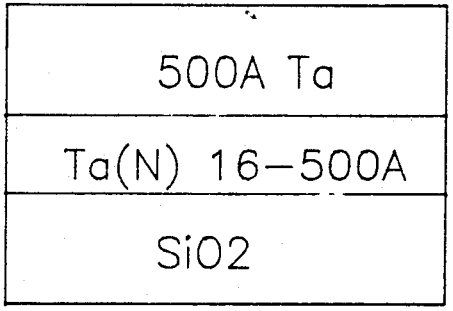
FIG. 2B shows a cross-sectional schematic view of a typical sample prepared to generate the plot for FIG. 2A.
Figure 2A:
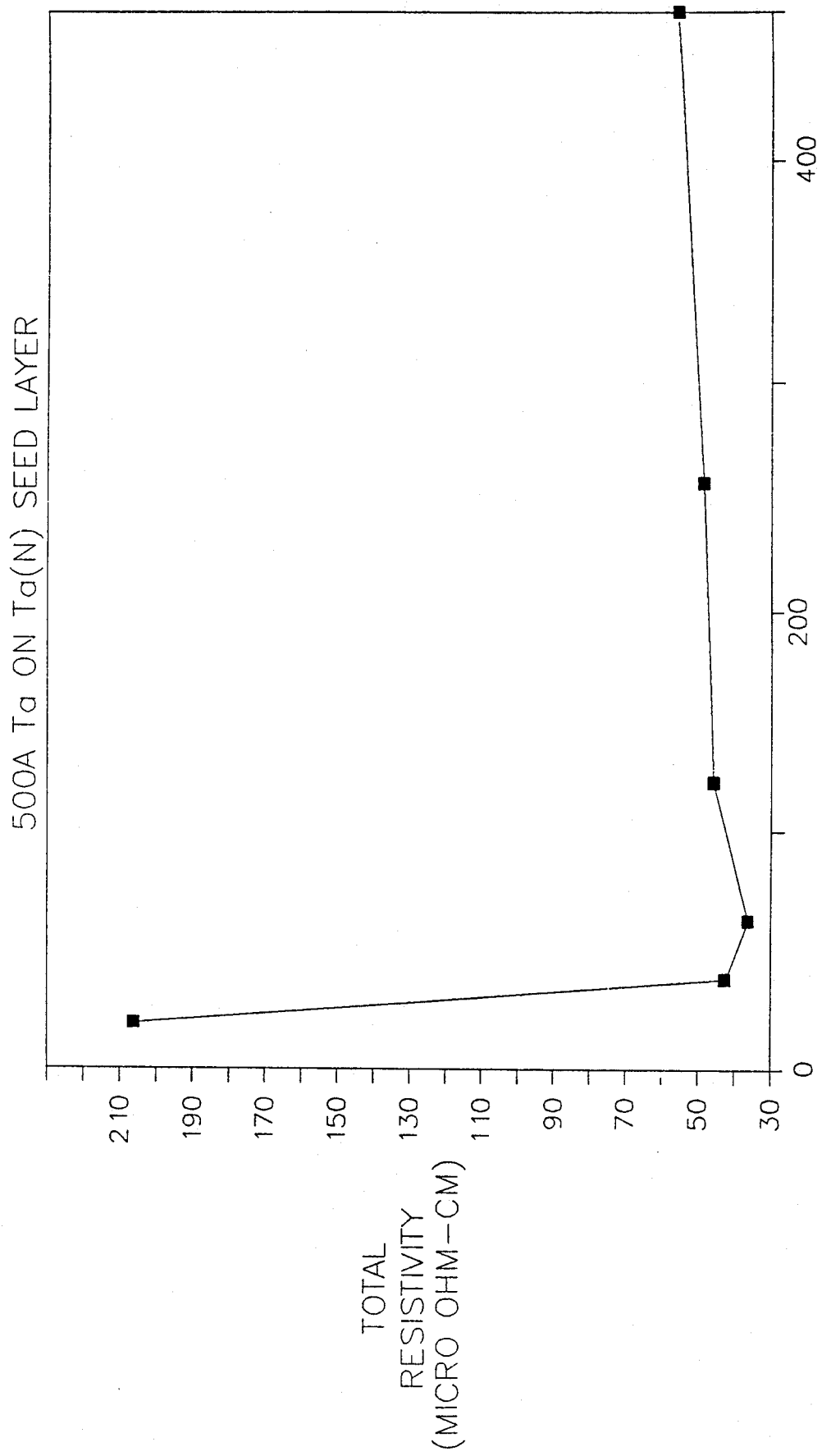
FIG. 2A is a plot showing the effect of the Ta(N) seed layer thickness on the resistivity of the total structure.

It should be noted that the doped tantalum seed layer is not the same as depositing $Ta_2N$, which requires precise control of the gas composition during the deposition process. In contrast to the work of Feinstein and Huttemann where the various metal seed layers were 5000 angstroms, the seed layer of this invention can be extremely thin (demonstrated to be as little as 32 angstroms or 3.2 nm) as shown in FIG. 2A, which plots total film resistivity (of the composite structure comprising the Ta(N) seed layer and the alpha-Ta layer) versus Ta(N) seed layer thickness. With a seed layer thickness of 16 angstroms (nominal thickness) or less, the resistivity was greater than 50 micro-ohm-cm, indicating the formation of beta-tantalum or a mixture of alpha and beta-tantalum. With thicker seed layers, 32 to 500 angstroms (nominal thickness), the total resistivity indicated the formation of alpha-tantalum. Therefore, it is assumed that seed layers as thin as 20 angstroms will result in alpha-Ta formation. The total resistivity increased with increased seed layer thickness due to the parallel resistance of the seed layer with the 500 angstrom alpha-tantalum overlayer.

The use of the seed layer results in tantalum films that are alpha (bcc) tantalum, as confirmed by X-ray diffraction analysis and the previously mentioned resistivity measurements. The resistivity of tantalum films doped with nitrogen is typically greater than 180 micro-ohm-cms, but the resistivity of the stack of the alpha-tantalum film deposited onto the seed layer can be as low as 20 to 40 micro-ohm-cms depending on the thicknesses as discussed elsewhere, for example as discussed in Example 2.

Figure 3A:
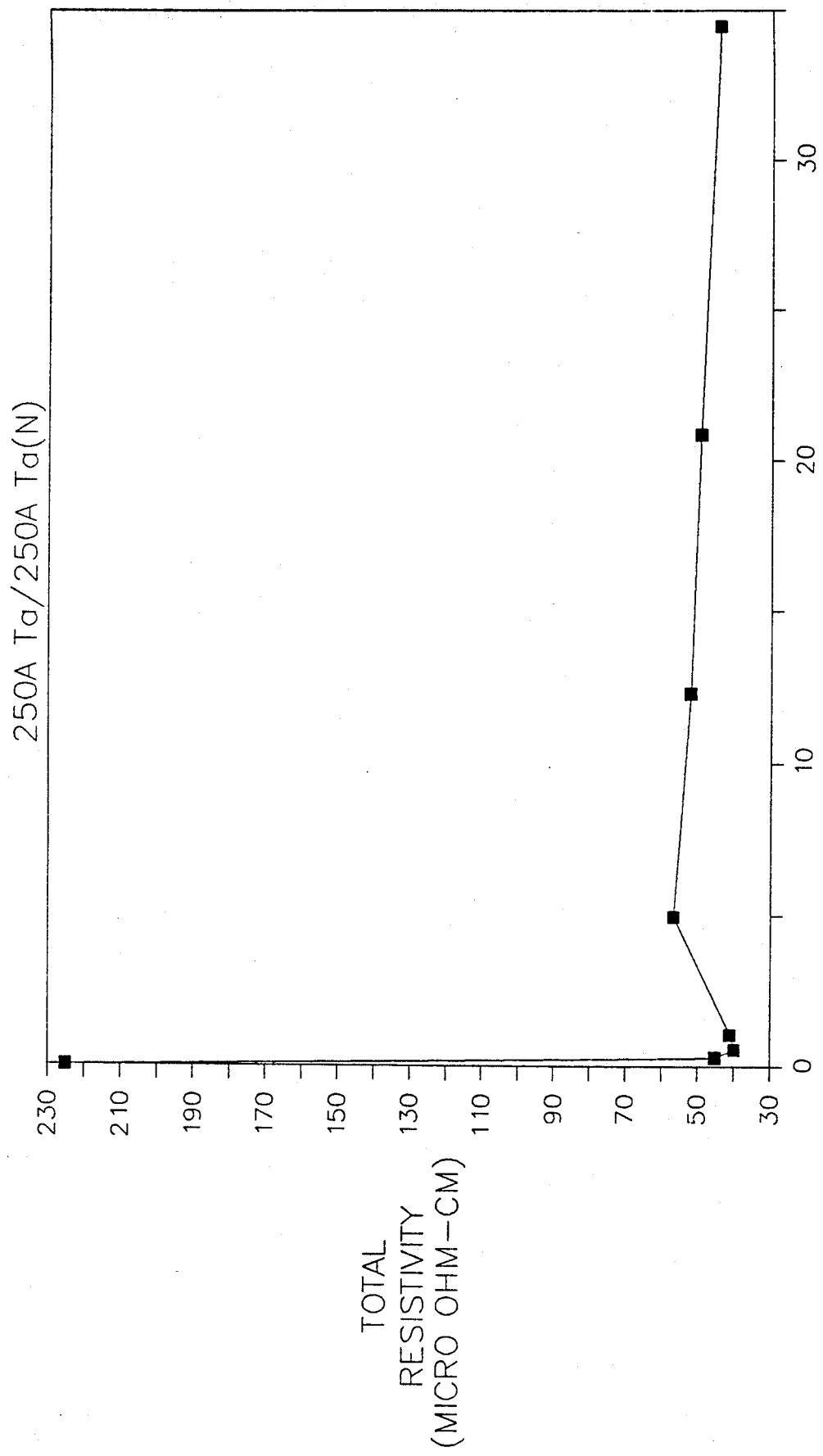
FIG. 3A is a plot showing the effect of the nitrogen concentration in argon, during seed layer deposition, on the resistivity of the total structure.

FIG. 3A shows the effect of the amount of nitrogen in the argon sputtering gas during the seed layer deposition on the total resistivity of the composite structure or film. With a constant Ta(N) seed layer thickness of 250 angstroms and Ta overlayer thickness of 250 angstroms, the percent of nitrogen in argon sputtering gas was varied from 0 to atomic percent. The total resistivity indicated that alpha-Ta was formed with between 0.3 percent to 35 atomic percent nitrogen in the argon during Ta(N) seed layer deposition. With no nitrogen present during the "seed layer" deposition, the high resistivity indicates the formation of beta-tantalum. Rutherford Backscattering Spectroscopy (RBS) detected between 5 percent and 50 percent nitrogen in the tantalum seed layer as the amount of nitrogen in the argon sputtering ambient varied from 0.5 percent to 35.0 percent. Alpha tantalum was also produced with 0.3 percent nitrogen in argon, but the nitrogen in the tantalum was below the lower detectable limit of RBS.

As shown in FIGS. 2A and 3A, the thickness of the seed layer is not critical for the formation of alpha-Ta, and neither high substrate temperature or controlled system impurities are required.

The process disclosed in this invention is easily done in-situ by introducing $N_2$ during the initial Ta deposition. As we have seen in FIG. 3A, that the amount of nitrogen in the seed layer is not critical; therefore, no sophisticated reactive sputtering processes are required.

If the alpha-tantalum layer is deposited in a batch tool, no intentional substrate heating is required. With a single wafer tool, the alpha-Ta layer could be deposited at temperatures of between 100° C. and 600° C., or preferably the alpha-Ta layer could be deposited at temperatures of equal to or less than 200° C.

EXAMPLES

The following examples are intended to further illustrate the invention and are not intended to limit the scope of the invention in any manner.

EXAMPLE 1

Typically, thin sputtered films are beta-Ta. A process has been developed in a batch tool. To deposit thin films of alpha-Ta, a Ta(N) seed layer is used. This process consists of depositing a seed layer of nitrided Ta (for example, 5 atomic percent $N_2$ in Ar during sputtering), which could be as thin as 32 Angstroms, and then sputtering Ta in argon with no nitrogen. The alpha-phase was produced, using between 0.3 atomic percent and 33.0 atomic percent $N_2$ in the Ar sputtering ambient during seed layer deposition with seed layer thickness above 32 Angstroms. The pressure was varied between 10 and 100 mT (milli-Torr) and alpha-Ta films as thin as 125 Angstroms were produced. No intentional substrate heating was used, although the literature has reported the need for substrate heating. Due to the large change in resistivity between the Alpha and Beta phases, the main measurement technique used was sheet resistivity. Additionally, X-ray diffraction was performed to verify the phase formed and RBS was used to determine the nitrogen content of the seed layer. The X-ray diffraction confirmed the formation of alpha (bcc) Ta in the samples having low resistivity.

EXAMPLE 2

A process has also been developed to produce thin, low resistivity (20 micro-ohm-cm) films of alpha-Ta on a Ta(N) seed layer using a single wafer tool. There is a wide process window in terms of $N_2$ flow during seed layer deposition, seed layer thickness, and substrate temperature.

The Ta deposition conditions were as follows: 1000 watts RF, 5.2 mT, 100 sccm Ar, 0-10 sccm $N_2$, and a substrate temperature between room temperature, which is approximately 20° C., and 300° C. Three separate sets of runs were performed, the $N_2$ flow during the seed layer deposition was varied (0-10 sccm), the seed layer thickness was varied (50-200 Angstroms), and the substrate temperature was varied (room temperature of 20° C.-300° C.)

The first runs varied the $N_2$ flow during seed layer deposition. The seed layer was 200 Angstroms thick, and a subsequent 750 Angstroms of Ta was sputtered onto the seed layer. The substrate temperature was 200° C. for all of these runs. With no seed layer, the resistivity was 115 micro-ohm-cm. For the runs with a seed layer, the resistivities were between 23.1 and 24.5 micro-ohm-cm. X-ray diffraction was performed on these films and verified that the films with a seed layer were in fact Alpha-Ta.

The second set of runs varied the seed layer thickness between 50 and 200 Angstroms, while keeping the total thickness constant (1000 Angstroms nominal). The substrate temperature was 200° C. The total resistivity (alpha-Ta and seed layer) increased from 18.7 to 23.0 micro-ohm-cm as the seed layer thickness increased, due to the increased seed layer contribution. The seed layer was sputtered in a 5 percent $N_2$ in Ar mixture, resulting in a resistivity of approximately 200 micro-ohm-cm for the Ta(N).

The final series of runs examined the effect of substrate heating. The total film thickness was approximately 1000Angstroms, with a 200 Angstrom Ta(N) (5 atomic percent nitrogen in Ar) seed layer, and 750 Angstroms of Ta. No intentional heating or cooling was used on the 22° C. sample; for this sample the temperature was not controlled or monitored and the temperature is assumed to have been at 22° C. The resistivities of the 22° C., 150° C., 200° C., and 300° C. samples or runs indicate that the 22° C. run was Beta (104 micro-ohm-cm) and the remainder were Alpha Ta (22.4 to 21.0 micro-ohm-cm). Samples prepared at 100° C. had intermediate resistivities (42 and 39 micro-ohm-cm), which perhaps indicates a mixture of Alpha and Beta-Ta phase.

There is a wide process window for producing Alpha-Ta films in a single wafer sputtering tool. The resistivity is low, about 20 micro-ohm-cm. Unlike previous work on a batch tool (Example 1), substrate temperature is important; a temperature of 150° C. or above is needed. This may be explained by the fact that with the batch tool, most processes heat the substrates to temperatures equal to or greater than 200° C. without intentional heating.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A product made by forming an alpha-Ta layer that does not contain any detectable amount of nitrogen on a substrate comprising the steps of:
   (a) forming a seed layer of tantalum doped with nitrogen (Ta(N)), reactively sputtered in a nitrogen containing ambient, on said substrate, wherein said seed layer has a thickness of at least 20 angstroms, and
   (b) depositing a layer of alpha-Ta on said Ta(N) seed layer in a nitrogen free ambient, wherein said layer or alpha-Ta does not contain any detectable amount of nitrogen and has a resistivity of less than 50 micro-ohm-cm.

2. An article of manufacture made by forming an alpha-Ta layer that does not contain any detectable amount of nitrogen on a substrate comprising the steps of:
   (a) forming a seed layer of tantalum doped with nitrogen (Ta(N)), reactively sputtered in a nitrogen containing ambient, on said substrate, wherein said seed layer has a thickness of at least 20 angstroms, and
   (b) depositing a layer of alpha-Ta on said (Ta(N) seed layer in a nitrogen free ambient, wherein said layer of alpha-Ta does not contain any detectable amount of nitrogen and has a resistivity of less than 50 micro-ohm-cm.

3. A structure comprising a seed layer of tantalum doped with nitrogen (Ta(N)) on a substrate, wherein said seed layer has a thickness of at least 20 angstroms, and having a layer of alpha-Ta on said Ta(N) seed layer, wherein said layer of alpha-Ta does not contain any detectable amount of nitrogen and has a resistivity of less than 50 micro-ohm-cm.

4. The structure of claim 3, wherein said layer of alpha-Ta is at least 100 angstroms thick.

5. The structure of claim 3, wherein the total thickness of said Ta(N) seed layer and said alpha-Ta layer is between 100 angstroms and 4,000 angstroms.

6. The structure of claim 3, wherein the total thickness of said Ta(N) seed layer and said alpha-Ta layer is between 500 angstroms and 2,000 angstroms.

7. A structure comprising a seed layer of tantalum doped with nitrogen (Ta(N)) on a substrate, and having a layer of alpha-Ta on said Ta(N) seed layer, wherein said seed layer of Ta(N) is at least 20 angstroms thick, and wherein said layer of alpha-Ta has a resistivity of less than 50 micro-ohm-cm.

8. The structure of claim 7, wherein said layer of alpha-Ta is at least 100 angstroms thick.

9. The structure of claim 7, wherein the total thickness of aid Ta(N) seed layer and said alpha-Ta layer is between 100 angstroms and 4,000 angstroms.

10. The structure of claim 7, wherein the total thickness of said Ta(N) seed layer and said alpha-Ta layer is between 500 angstroms and 2,000 angstroms.

11. The structure of claim 3, wherein the resistivity of said alpha-Ta layer is equal to or less than 40 micro-ohm-cm.

12. The product of claim 1, wherein the resistivity of said alpha-Ta layer is equal to or less than 40 micro-ohm-cm.

13. The article of manufacture of claim 2, wherein the resistivity of said alpha-Ta layer is equal to or less than 40 micro-ohm-cm.

14. The structure of claim 7, wherein the resistivity of said alpha-Ta layer is equal to or less than 40 micro-ohm-cm.

15. The product of claim 1, wherein said seed layer of Ta(N) preferably contains between 0.1 and 50.0 atomic percent nitrogen.

16. The article of manufacture of claim 2, wherein said seed layer of Ta(N) preferably contains between 0.1 and 50.0 atomic percent nitrogen.

17. The structure of claim 3, wherein said seed layer of Ta(N) preferably contains between 0.1 and 50.0 atomic percent nitrogen.

18. The structure of claim 7, wherein said seed layer of Ta(N) preferably contains between 0.1 and 50.0 atomic percent nitrogen.

19. The structure of claim 3, wherein said seed layer of Ta(N) preferably contains between 0.1 and 35.0 atomic percent nitrogen.

20. The structure of claim 7, wherein said seed layer of Ta(N) preferably contains between 0.1 and 35.0 atomic percent nitrogen.

21. The product of claim 1, wherein said seed layer of Ta(N) contains between 1 and 35 atomic percent nitrogen.

22. The article of manufacture of claim 2, wherein said seed layer of Ta(N) contains between 1 and 35 atomic percent nitrogen.

23. The structure of claim 3, wherein said seed layer of Ta(N) contains between 1 and 35 atomic percent nitrogen.

24. The structure of claim 7, wherein said seed layer of Ta(N) contains between 1 and 35 atomic percent nitrogen.

25. The structure of claim 3, wherein said seed layer of Ta(N) contains between 0.1 and 1.0 atomic percent nitrogen.

26. The structure of claim 7, wherein said seed layer of Ta(N) contains between 0.1 and 1.0 atomic percent nitrogen.

* * * * *